US012711286B2

(12) United States Patent
Luo et al.

(10) Patent No.: US 12,711,286 B2
(45) Date of Patent: Aug. 18, 2026

(54) DEVICE AND A METHOD FOR ACCURATELY MAPPING THE BUILDING INFORMATION MODELING AND THE INTERNET OF THINGS MONITORING ITEM

(71) Applicants: Lv Luo, Changsha (CN); Tuo Shi, Changsha (CN); Dayu Lai, Changsha (CN); Xun Huang, Changsha (CN); Wei Huang, Changsha (CN)

(72) Inventors: Lv Luo, Changsha (CN); Tuo Shi, Changsha (CN); Dayu Lai, Changsha (CN); Xun Huang, Changsha (CN); Wei Huang, Changsha (CN)

(73) Assignees: Hunan Construction Investment Group Co., Ltd, Changsha City (CN); China-Hunan Intelligent Construction Co., Ltd, Changsha City (CN)

( * ) Notice: Subject to any disclaimer, the term of this patent is extended or adjusted under 35 U.S.C. 154(b) by 1383 days.

(21) Appl. No.: 17/331,660

(22) Filed: May 27, 2021

(65) Prior Publication Data

US 2022/0075908 A1 Mar. 10, 2022

(30) Foreign Application Priority Data

Sep. 8, 2020 (CN) ......................... 202010934343.0

(51) Int. Cl.
*G06F 30/13* (2020.01)
*G16Y 10/80* (2020.01)
(Continued)

(52) U.S. Cl.
CPC .............. *G06F 30/13* (2020.01); *G16Y 10/80* (2020.01); *G16Y 40/10* (2020.01); *H04L 67/12* (2013.01)

(58) Field of Classification Search
CPC ...................................................... G06F 30/13
(Continued)

(56) References Cited

FOREIGN PATENT DOCUMENTS

CN 108520342 A * 9/2018 ............. G06F 30/13
WO WO-2020264095 A1 * 12/2020 ............. G05B 15/02

OTHER PUBLICATIONS

A review of building information modeling (BIM) and the internet of things (IoT) devices integration: Present status and future trends (Year: 2019).*

(Continued)

*Primary Examiner* — John E Johansen
*Assistant Examiner* — Adam Carrero
(74) *Attorney, Agent, or Firm* — Nitin Kaushik

(57) ABSTRACT

A device and a method for accurately mapping the building information modeling and the Internet of Things monitoring item based on building information modeling and building intellectual management, the device comprises: a key field identification module for screening an component ID code with entity monitoring data feedback from any building information modeling component with component ID code; an addressing module, which is based on an API interface of building intelligent subsystem, to obtain the IP address of terminal equipment Internet of Things equipment and the dynamic monitoring information of the equipment; an Internet of Things analysis module which is used for accurately analyzing the Internet of Things equipment communication signal; a rule mapping module which is used for generating a building information modeling and building entity equipment mapping rule to achieve accurate mapping.

3 Claims, 2 Drawing Sheets

(51) Int. Cl.
*G16Y 40/10* (2020.01)
*H04L 67/12* (2022.01)

(58) Field of Classification Search
USPC .............................................................. 703/1
See application file for complete search history.

(56) References Cited

OTHER PUBLICATIONS

Shu Tang, A review of building information modeling (BIM) and the internet of things (IoT) devices integration: Present status and future trends (Year: 2019).*

* cited by examiner

DEVICE AND A METHOD FOR ACCURATELY MAPPING THE BUILDING INFORMATION MODELING AND THE INTERNET OF THINGS MONITORING ITEM

TECHNICAL FIELD

The invention relates to the technical field of intellectual building information system, in particular to a device and a method for accurately mapping the building information modeling and the Internet of Things monitoring item based on building information modeling and building intellectual management.

BACKGROUND ART

Building Information Modeling (BIM) can realize project supervision, property management, equipment management, digital processing, engineering management is based on various relevant information data of building projects, through the three-dimensional building model, to realize the functions of engineering supervision, property management, equipment management, digital processing, engineering management and so on. It has unique advantages in visualized analysis, big data management, work collaboration, and information sharing.

The Internet of Things (IoT) refers to connection of any objects with the Internet in use of information sensing device and according to agreed agreement, the objects perform information exchange and communication by information medium, thereby realizing intelligent identification, positioning, tracing and monitoring, etc.

The building information modeling and the Internet of Things technology are complementary to each other, the building information modeling technology is used to realize the positioning and management of operation and maintenance management objects in the three-dimensional space of the building; the Internet of Things technology is used to realize the collection and processing of real-time data, and the information interaction and communication between building elements. communication. By binding the building information modeling technology and Internet of Things technology to scientifically manage the space and equipment assets of the building, to prevent possible losses, reduce building operation and maintenance costs, and finally realize many applications such as equipment operation management, energy consumption management, and fire management, and etc. Many similar building information models+Internet of Things applications derived from this concept have emerged in an endless stream, however, in actual implementation, the owner only got a "useless" building information modeling or a set of application software so-called "building information modeling+Internet of Things" that could not be implemented, the reason thereof is that the data information collected by the Internet of Things terminal equipment cannot accurately match corresponding building information modeling components. Therefore, there is an urgent need to study a device and method for accurately mapping the building information modeling and the Internet of Things monitoring item, thereby realizing the data interaction and information fusion between building dynamic data and virtual models, thereby improving the level of building operation and maintenance.

SUMMARY OF THE INVENTION

The technical problem to be solved by the invention is to provide a device and method for accurately mapping a building information modeling and an Internet of Things monitoring item, thereby realizing the data interaction and information fusion between the building dynamic data and the virtual modeling, and improving the level of building operation and maintenance.

In order to solve the technical problem, the invention adopts the following technical schemes:

the invention provides a device for accurately mapping a building information modeling and an Internet of Things monitoring item, comprising:

a key field identification module for screening an component ID code with entity monitoring data feedback from any building information modeling component with component ID code;

an addressing module, which is based on an API interface of building intelligent subsystem, to obtain the IP address of terminal equipment Internet of Things equipment and the dynamic monitoring information of the equipment;

an Internet of Things analysis module which is used for accurately analyzing the Internet of Things equipment feedback data;

a rule mapping module which is used for generating a building information modeling and building entity equipment mapping rule to achieve accurate mapping;

the rule mapping module is respectively connected to the key field identification module and the Internet of Things analysis module, the rule mapping module extracts the building information modeling code information from the key field identification module, extracts a translation signal of the Internet of Things monitoring item and the IP address information of the Internet of Things equipment from the Internet of Things analysis module, and performs matching and association in the rule mapping module;

the addressing module is connected to the Internet of Things analysis module, the Internet of Things analysis module analyzes electrical signal information extracted by the addressing module and uploads the same to the rule mapping module.

Further, the key field identification module comprises:

identification unit, for defining key field identification code to each component of any building information modeling component to which it belongs, which is used to identify the ID code of similar components;

screening unit, for screening all such equipment component ID codes in the building information modeling based on the key field identification when the terminal equipment has data feedback;

linkage unit, for loading corresponding component in the building information modeling based on any one of the screened codes of all such equipment components, and locating the position of the component.

Further, the addressing module comprises:

address obtaining unit, for obtaining effective physical address of the Internet of Things terminal equipment in the building;

communication module unit, which is based on an API interface of building intelligent subsystem (or Internet of Things equipment), to establish different access mechanisms to communicate with the intelligent subsystems (or Internet of Things equipment) in the building;

data acquisition unit, acquiring monitoring data code information of the Internet of Things terminal equipment, and storing the code information in a structured segment according to naming rules of the monitoring items.

Further, the communication module unit comprises:

standard interface components, which is used to group communication interfaces of different systems, different brands, and different protocols to form modular standard interface components;

data encapsulation components, which is used to encapsulate the data of different groups of interfaces according to the group;

interface switching components, for selecting corresponding interface component to switch and bind according to the building intelligent subsystem and brand to which the Internet of Things terminal equipment belongs, and establishing a communication connection.

Further, the Internet of Things analysis module comprises:

monitoring item analysis unit, which is used to analyze feedback data code of monitoring device;

bridging unit, which is based on the key field identification code, to associate interpretative information of the monitoring item of the Internet of Things terminal equipment with the ID code of the building information modeling component.

Further, the monitoring item analysis unit comprises:

monitoring item resource pool, which is used to store Chinese name of monitoring item of Internet of Things terminal equipment;

monitoring item custom component, which is used to define feedback data types for the Internet of Things equipment, such as numeric type, Boolean type and so on;

monitoring item switching component, which is used to perform equal-scale conversion of feedback values of monitoring items;

monitoring item extension component, which is used to add, delete and modify the monitoring item information.

Further, the rule mapping module comprises:

code mapping unit, which is used to match building information modeling code with IP addresses of Internet of Things equipment;

monitoring item translation unit, which is used to translate monitoring code information acquired by standard interface components into standard interpretative language.

The method for accurately mapping the building information modeling and the Internet of Things monitoring item, comprising the following steps:

step 1: component coding, ID coding for each component of building information modeling;

step 2: key field definition, extracting key field in the building information modeling component code to form identification code;

step 3: monitoring item configuration, adding monitoring item and relative attribute information for each component with Internet of Things monitoring, and associating the identification code of building information modeling component in step 2;

step 4: code screening, based on the identification code in step 2 and step 3, screening building information modeling component ID code participating in mapping and relative monitoring item thereof;

step 5: data collecting, based on the API interface of building intelligent subsystem (or Internet of Things equipment), obtaining the IP address information of the Internet of Things equipment and monitoring data code information;

step 6: code mapping, extracting the IP address of the Internet of Things equipment participating in the mapping obtained in step 5, and performing one-to-one association binding with the component ID code participating in the mapping screened out in step 4.

step 7: monitoring item translation, extracting the monitoring data code information in step 5 to perform one-to-one association binding with Chinese name of Internet of Things monitoring item screened in step 4, realizing two-way association mapping between code information of the monitoring item and the attribute information of the Internet of Things monitoring item.

Further, the step 3 also comprises:

step 3.1: according to the addressing module, determining the monitoring information of the Internet of Things terminal equipment participating in the mapping, and storing the same in real-time database;

step 3.2: according to the Internet of Things analysis module, associating the identification code in step 2 with the monitoring information of the Internet of Things terminal equipment participating in the mapping.

Further, the step 6 also comprises:

step 6.1: according to the linkage unit, interacting the ID code of the building information modeling component participating in the mapping screened out based on the identification code to the building information modeling, the corresponding component is loaded, and the component position is located;

step 6.2: according to the location of component, determining the location of the Internet of Things terminal equipment participating in the mapping;

step 6.3: according to the address obtaining unit, obtaining the Internet of Things equipment IP address;

step 6.4: according to the code mapping unit, binding the ID code of the building information modeling component participating in the mapping and the IP address of the Internet of Things equipment participating in the mapping;

Further, the step 7 also comprises:

step 7.1: according to the IP address of the Internet of Things equipment, obtaining the monitoring data code of the Internet of Things terminal equipment;

step 7.2: according to data acquisition unit, storing the obtained monitoring data code of the Internet of Things terminal equipment in a structured segment according to naming rules of the monitoring items;

step 7.3: according to bridging unit, the ID code of the building information modeling component participating in the mapping is automatically bonded with the interpretative information of the Internet of Things monitoring item;

step 7.4: after the ID code of the building information modeling component is bonded with the IP address of the Internet of Things equipment, one-to-one association binding the stored monitoring data code in segment with the interpretative information of the Internet of Things monitoring item, thereby realizing two-way association mapping between code information of the monitoring item and the attribute information of the Internet of Things monitoring item.

The advantageous effects of the invention: the invention first bridges and associates the building information modeling component code with the monitoring item interpretative information through the key field identification code; uses the addressing module to obtain the Internet of Things terminal equipment IP address and monitoring code information; and then uses the rule mapping module to associate and bind the ID code of the building information modeling component with the terminal equipment of the Internet of Things, thereby realizing two-way association mapping between the building information modeling and the terminal equipment of the Internet of Things; in addition, the Internet of Things analysis module is used to analyze the monitoring information of the Internet of Things terminal equipment participating in the mapping, simultaneously, translation Internet of Things translation module is used to accurately translate the monitoring data code information to form a standard interpretation language, which can realize the full use of the Internet of Things monitoring data. The invention can solve the problems of data interaction and information fusion between real construction equipment and virtual models, and effectively improve the efficiency of supervision, management and control of construction equipment.

BRIEF DESCRIPTION OF ACCOMPANYING DRAWINGS

SPECIFIC EMBODIMENT OF THE INVENTION

Hereinafter, the invention will be described in detail with reference to the accompanying drawings and the embodiments. The following embodiments will help those skilled in the art to further understand the invention, however, do not limit the invention in any form. It should be pointed out that several modifications and improvements can be made without departing from the concept of the invention. These all belong to the protection scope of the invention.

Embodiment

Figure 1:
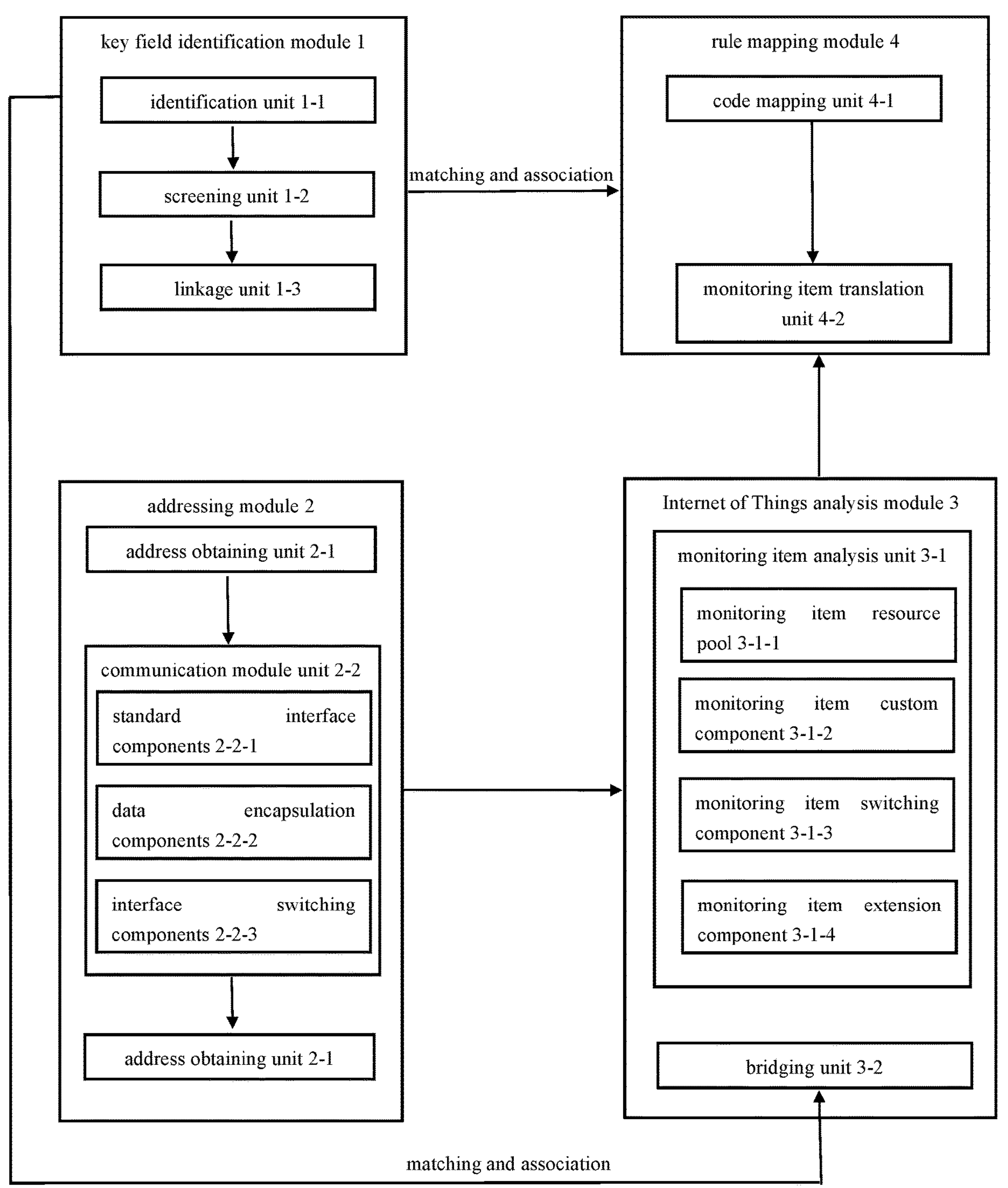
FIG. 1 is a specific structure diagram of a device for accurately mapping a building information modeling and an Internet of Things monitoring item in an embodiment of the invention.

As shown in FIG. 1, the device for accurately mapping a building information modeling and an Internet of Things monitoring item in the embodiment, comprising:

a key field identification module 1 for screening an component ID code with entity monitoring data feedback from any building information modeling component with component ID code;

an addressing module 2, which is based on an API interface of building intelligent subsystem (or Internet of Things equipment), to obtain the IP address of terminal equipment Internet of Things equipment and the dynamic monitoring information of the equipment;

an Internet of Things analysis module 3 which is used for accurately analyzing the Internet of Things equipment communication signal;

and a rule mapping module 4 which is used for generating a building information modeling and building entity equipment mapping rule to achieve accurate mapping;

the rule mapping module 4 is respectively connected to the key field identification module 1 and the Internet of Things analysis module 3, the rule mapping module 4 extracts the building information modeling code information from the key field identification module 1, extracts a translation signal of the Internet of Things monitoring item and the IP address information of the Internet of Things equipment from the Internet of Things analysis module 3, and performs matching and association in the rule mapping module;

the addressing module 2 is connected to the Internet of Things analysis module 3, the Internet of Things analysis module 3 analyzes electrical signal information extracted by the addressing module 2 and uploads the same to the rule mapping module.

In the embodiment, the key field identification module 1 comprises: identification unit 1-1 for defining key field identification code to each component of any building information modeling component to which it belongs; screening unit 1-2 for screening all such equipment component ID codes; and linkage unit 1-3 locating the position of the component.

In the embodiment, the addressing module 2 comprises:

address obtaining unit 2-1, for obtaining effective physical address of the Internet of Things terminal equipment in the building;

communication module unit 2-2, which is based on an API interface of building intelligent subsystem (or Internet of Things equipment), to establish different access mechanisms to communicate with the intelligent subsystems (or Internet of Things equipment) in the building;

data acquisition unit 2-3, acquiring monitoring data code information of the Internet of Things terminal equipment, and storing the code information in a structured segment according to naming rules of the monitoring items.

wherein, the communication module unit comprises:

standard interface components 2-2-1, which is used to group communication interfaces of different systems, different brands, and different protocols to form modular standard interface components;

data encapsulation components 2-2-2, which is used to encapsulate the data of different groups of interfaces according to the group;

interface switching components 2-2-3, for selecting corresponding interface component to switch and bind according to the building intelligent subsystem and brand to which the Internet of Things terminal equipment belongs, and establishing a communication connection.

In the embodiment, the Internet of Things analysis module 3 comprises:

monitoring item analysis unit 3-1, which is used to analyze feedback data of monitoring device;

bridging unit 3-2, which is based on the key field identification code, to associate interpretative information of the monitoring item of the Internet of Things terminal equipment with the ID code of the building information model component.

wherein, the monitoring item analysis unit 3-1 comprises:

monitoring item resource pool 3-1-1, which is used to store Chinese name of monitoring item of Internet of Things terminal equipment;

monitoring item custom component 3-1-2, which is used to define data types for the Internet of Things equipment feedback, such as numeric type, Boolean type and so on;

monitoring item switching component 3-1-3, which is used to perform equal-scale conversion of feedback values of monitoring items;

monitoring item extension component 3-1-4, which is used to add, delete and modify the monitoring item information.

In the embodiment, the rule mapping module 4 comprises:

code mapping unit 4-1, which is used to match building information modeling code with IP addresses of Internet of Things equipment;

monitoring item translation unit 4-2, which is used to translate monitoring code information acquired by standard interface components into standard interpretative language.

Figure 2:
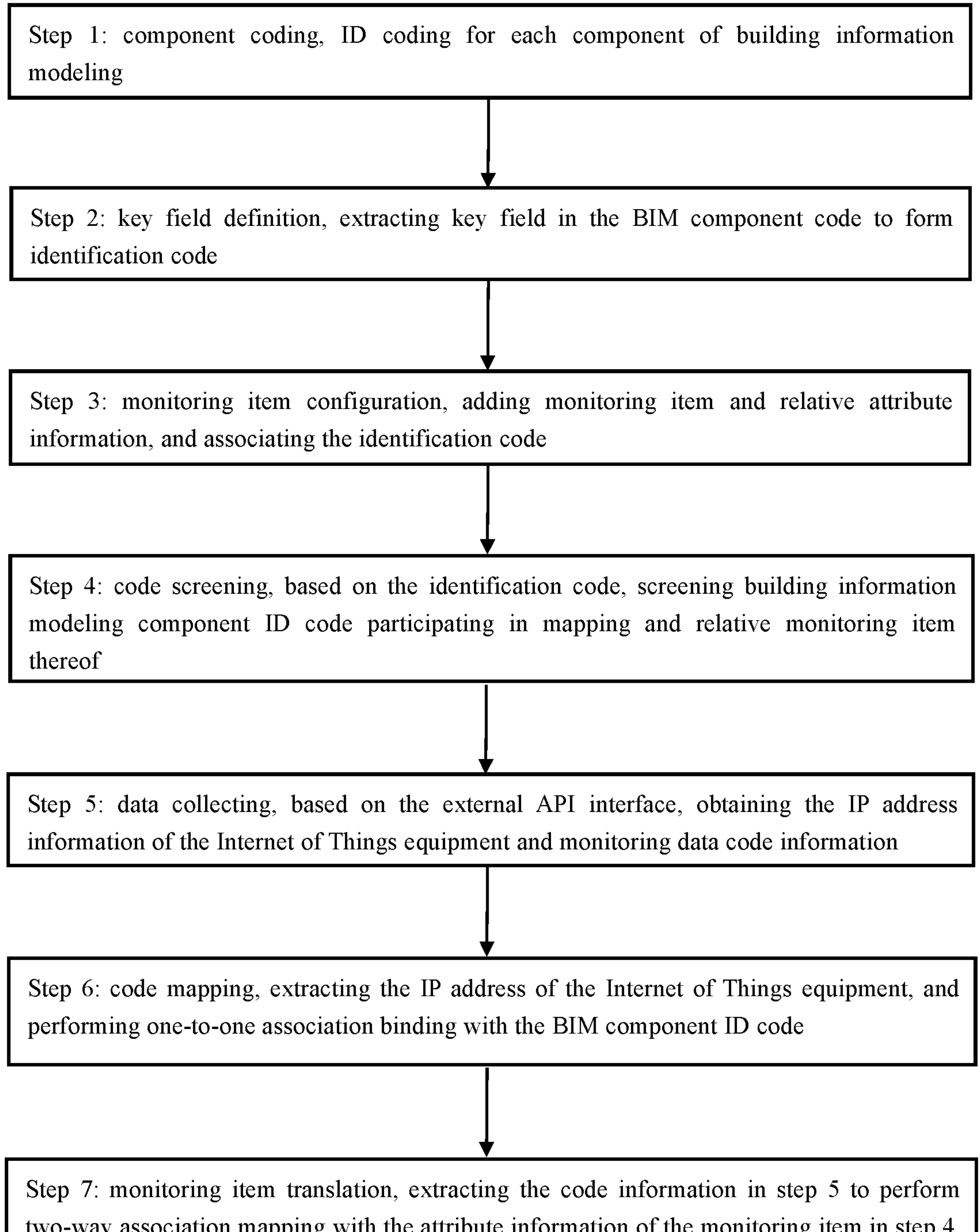
FIG. 2 is a flow diagram of a method for accurately mapping a building information modeling and an Internet of Things monitoring item in an embodiment of the invention.

As shown in FIG. 2, the method for accurately mapping a building information modeling and an Internet of Things monitoring item in the embodiment, comprising the following steps:

step 1: component coding, ID coding for each component of building information modeling;

step 2: key field definition, extracting key field in the building information modeling component code to form identification code;

step 3: monitoring item configuration, adding monitoring item and relative attribute information for each component with Internet of Things monitoring, and associating the identification code of building information modeling component in step 2;

step 4, code screening, based on the identification code in step 2 and step 3, screening building information modeling component ID code participating in mapping and relative monitoring item thereof;

step 5: data collecting, based on the API interface of building intelligent subsystem (or Internet of Things equipment), obtaining the IP address information of the Internet of Things equipment and monitoring data code information;

step 6: code mapping, extracting the IP address of the Internet of Things equipment participating in the mapping obtained in step 5, and performing one-to-one association binding with the component ID code participating in the mapping screened out in step.

step 7: monitoring item translation, extracting the monitoring data code information in step 5 to perform one-to-one association binding with Chinese name of Internet of Things monitoring item screened in step 4, realizing two-way association mapping between code information of the monitoring item and the attribute information of the Internet of Things monitoring item.

Wherein, the step 3 also comprises:

step 3.1: according to the addressing module, determining the monitoring information of the Internet of Things terminal equipment participating in the mapping, and storing the same in real-time database;

step 3.2: according to the Internet of Things analysis module, associating the identification code in step 2 with the monitoring information of the Internet of Things terminal equipment participating in the mapping.

The step 6 also comprises:

step 6.1: according to the linkage unit, interacting the ID code of the building information modeling component participating in the mapping screened out based on the identification code to the building information modeling, the corresponding component is loaded, and the component position is located;

step 6.2: according to the location of component, determining the location of the Internet of Things terminal equipment participating in the mapping;

step 6.3: according to the address obtaining unit, obtaining the Internet of Things equipment IP address;

step 6.4: according to the code mapping unit, binding the ID code of the building information modeling component participating in the mapping and the IP address of the Internet of Things equipment participating in the mapping;

the step 7 also comprises:

step 7.1: according to the IP address of the Internet of Things equipment, obtaining the monitoring data code of the Internet of Things terminal equipment;

step 7.2: according to data acquisition unit, storing the obtained monitoring data code of the Internet of Things terminal equipment in a structured segment according to naming rules of the monitoring items;

step 7.3: according to bridging unit, the ID code of the building information modeling component participating in the mapping is automatically bonded with the interpretative information of the Internet of Things monitoring item;

step 7.4: after the ID code of the building information modeling component is bonded with the IP address of the Internet of Things equipment, one-to-one association binding the stored monitoring data code in segment with the interpretative information of the Internet of Things monitoring item, thereby realizing two-way association mapping between code information of the monitoring item and the attribute information of the Internet of Things monitoring item.

The invention claimed is:

1. A method for accurately mapping building information modeling and an Internet of Things monitoring item, comprising following steps:

step 1: component coding, performing identity (ID) coding for each component of building information modeling;

step 2: key field definition, extracting key field in a building information modeling component code to form identification code;

step 3: monitoring item configuration, adding monitoring item and relative attribute information for each component with Internet of Things monitoring, and associating the identification code of building information modeling component in step 2;

step 4, code screening, based on the identification code in step 2 and step 3, screening building information modeling component ID code participating in mapping and relative monitoring item thereof;

step 5: data collecting, based on an application programming interface (API) of building intelligent subsystem, obtaining an internet protocol (IP) address information of an Internet of Things equipment and monitoring data code information;

step 6: code mapping, extracting the IP address of the Internet of Things equipment participating in the mapping obtained in step 5, and performing one-to-one association binding with the component ID code participating in the mapping screened out in step 4;

step 7: monitoring item translation, extracting the monitoring data code information in step 5 to perform one-to-one association binding with Chinese name of Internet of Things monitoring item screened in step 4, realizing two-way association mapping between code information of the monitoring item and the attribute information of the Internet of Things monitoring item.

2. The method for accurately mapping the building information modeling and the Internet of Things monitoring item of claim 1, the step 3 also comprising:

step 3.1: determining monitoring information of the Internet of Things equipment participating in the mapping, and storing the monitoring information in real-time database;

Step 3.2: associating the identification code in step 2 with the monitoring information of the Internet of Things equipment participating in the mapping.

3. The method for accurately mapping the building information modeling and the Internet of Things monitoring item of claim 1, the step 6 also comprises:

step 6.1: interacting the ID code of the building information modeling component participating in the mapping screened out based on the identification code to the building information modeling, the corresponding component is loaded, and the component position is located;

step 6.2: according to a location of component, determining a location of the Internet of Things equipment participating in the mapping;

step 6.3: obtaining the Internet of Things equipment IP address;

step 6.4: binding the ID code of the building information modeling component participating in the mapping and the IP address of the Internet of Things equipment participating in the mapping;

the step 7 also comprises:

step 7.1: according to the IP address of the Internet of Things equipment, obtaining the monitoring data code of the Internet of Things terminal equipment;

step 7.2: storing the obtained monitoring data code of the Internet of Things terminal equipment in a structured segment according to naming rules of the monitoring items;

step 7.3: automatically binding the ID code of the building information modeling component participating in the mapping with interpretative information of the Internet of Things monitoring item;

Step 7.4: after the ID code of the building information modeling component is bonded with the IP address information of the Internet of Things equipment, one-to-one association binding the stored monitoring data code in segment with the interpretative information of the Internet of Things monitoring item, thereby realizing two-way association mapping between code information of the monitoring item and the attribute information of the Internet of Things monitoring item.

* * * * *